United States Patent
Ference et al.

(10) Patent No.: US 6,265,771 B1
(45) Date of Patent: Jul. 24, 2001

(54) DUAL CHIP WITH HEAT SINK

(75) Inventors: Thomas G. Ference, Essex Junction; Wayne J. Howell, Williston; Edmund J. Sprogis, Colchester, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/238,492

(22) Filed: Jan. 27, 1999

(51) Int. Cl.[7] .......................... H01L 23/10; H01L 23/34; H01L 23/02; H01L 23/495

(52) U.S. Cl. .......................... 257/706; 257/707; 257/685; 257/686; 257/676

(58) Field of Search .................... 257/706, 707, 257/712, 796, 676, 777, 778, 779, 713, 686, 685, 723, 684

(56) References Cited

U.S. PATENT DOCUMENTS

| | | | |
|---|---|---|---|
| 4,091,408 | * 5/1978 | Lee et al. ........................... | 357/56 |
| 4,393,393 | * 7/1983 | Allen, Jr. et al. ................... | 357/81 |
| 4,878,106 | * 10/1989 | Sachs ................................. | 357/72 |
| 5,065,281 | 11/1991 | Hernandez et al. . | |
| 5,199,164 | * 4/1993 | Kim et al. ............................ | 29/840 |
| 5,295,044 | * 3/1994 | Araki et al. ......................... | 257/713 |
| 5,297,006 | 3/1994 | Mizukoshi . | |
| 5,332,921 | * 7/1994 | Dousen et al. ...................... | 257/685 |
| 5,345,106 | 9/1994 | Doering et al. . | |
| 5,377,077 | * 12/1994 | Burns ................................. | 361/704 |
| 5,394,298 | 2/1995 | Sagisaka . | |
| 5,508,565 | * 4/1996 | Hatakeyame et al. ............. | 257/777 |
| 5,510,956 | 4/1996 | Suzuki . | |
| 5,578,869 | * 11/1996 | Hoffman et al. ................... | 257/691 |
| 5,594,282 | * 1/1997 | Otsuki ................................ | 257/796 |
| 5,615,475 | * 4/1997 | Burns ................................. | 257/686 |
| 5,703,400 | * 12/1997 | Wojnarowski et al. ............ | 257/723 |
| 5,777,381 | * 7/1998 | Nishida .............................. | 257/693 |
| 5,792,677 | * 8/1998 | Reddy et al. ...................... | 438/122 |
| 5,818,107 | * 10/1998 | Pierson et al. ..................... | 257/723 |
| 5,866,943 | * 2/1999 | Mertol ............................... | 257/712 |
| 5,886,408 | * 3/1999 | Ohki et al. ......................... | 257/796 |
| 5,910,682 | * 6/1999 | Song .................................. | 257/685 |

FOREIGN PATENT DOCUMENTS

| | | | |
|---|---|---|---|
| 000484180 | 5/1992 | (EP) . | |
| 360137042 | * 7/1985 | (JP) .................................. | 257/796 |
| 405129516 | * 5/1993 | (JP) .................................. | 257/778 |
| 406021328 | 1/1994 | (JP) . | |
| 406097326 | * 4/1994 | (JP) .................................. | 257/796 |
| 406132474 | * 5/1994 | (JP) .................................. | 257/778 |

* cited by examiner

*Primary Examiner*—Eddie Lee
*Assistant Examiner*—Jesse A. Fenty
(74) *Attorney, Agent, or Firm*—James M. Leas

(57) ABSTRACT

An apparatus for simultaneously removing heat from two surfaces of a semiconductor structure includes a heat sink mounted to a front surface and a heat sink mounted to a back surface of the semiconductor structure. The structure can be two chips mounted in face-to-face arrangement, and the heat sinks remove heat from back surfaces of both chips.

6 Claims, 5 Drawing Sheets

DUAL CHIP WITH HEAT SINK

FIELD OF THE INVENTION

This invention generally relates to apparatus for removing heat from integrated circuits. More particularly it relates to arrangements for removing heat from a stack of integrated circuits.

BACKGROUND OF THE INVENTION

Heat sinks and heat slugs have been used to remove heat from the back of high power integrated circuit chips, as shown in U.S. Pat. Nos. 5,394,298 and 5,297,006. The thermal performance of these systems has not been adequate to accommodate very high power chips, however. The problem has been compounded for semiconductor structures in which chips are stacked. Thus, a better solution is needed that provides for improved heat removal, and this solution is provided by the following invention.

SUMMARY OF THE INVENTION

It is therefore an object of the present invention to provide an improved arrangement for removing heat from an integrated circuit chip or a stack of integrated circuit chips.

It is another object of the present invention to provide multiple heat sinks for a semiconductor structure.

It is another object of the present invention to provide a heat sink for a plurality of major surfaces of a semiconductor structure.

It is another object of the present invention to provide a heat sink for each chip of a dual chip stack.

It is a feature of the present invention that a heat sink is provided on the back of each chip of a dual chip stack.

It is an advantage of the present invention that heat is removed from the chips of a dual chip stack in an inexpensive package, such as a plastic package.

These and other objects, features, and advantages of the invention are accomplished by a semiconductor module, comprising a semiconductor structure having a first surface and a second surface. A first heat sink or heat slug thermally contacts the first surface. A second heat sink or heat slug thermally contacts the second surface.

DESCRIPTION OF THE INVENTION

The present invention provides a way to improve the cooling of high power chips and stacks of chips. Heat sinks or heat slugs are connected to a plurality of major surfaces of the chip or stack of chips so that the chip or chips can operate at a significantly lower temperature than would be possible using a single heat sink or heat slug. The chips with their heat sinks are then encapsulated in a plastic package or other package.

Figure 1:
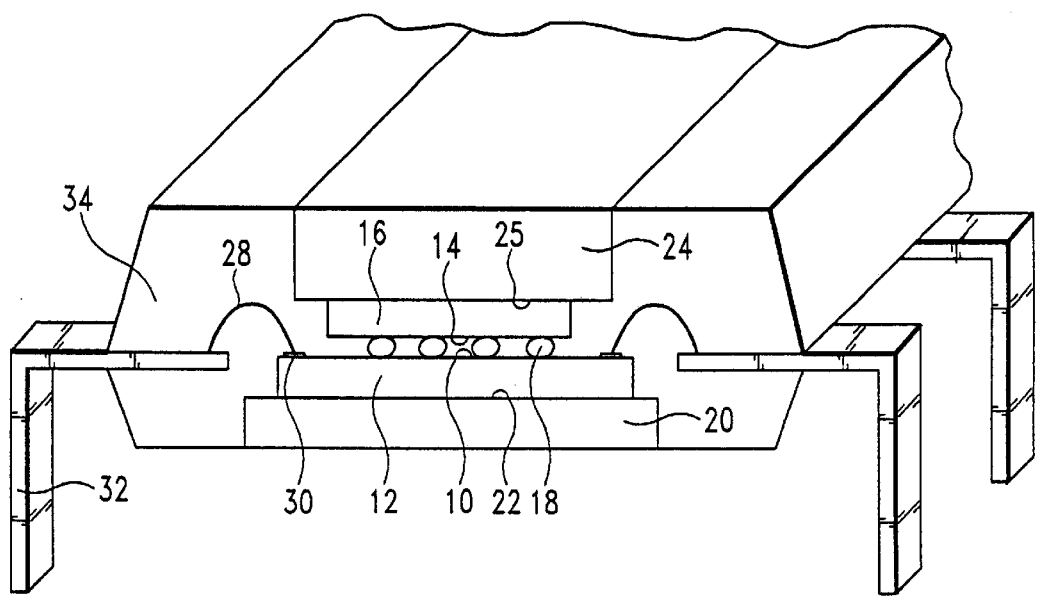
FIG. 1 is a perspective and a cross sectional view of a encapsulated module of the present invention, including stacked chips, each with a heat sink, in a lead frame package.

In one embodiment, active surface 10 of integrated circuit chip 12 faces active surface 14 of integrated circuit chip 16, and contacts on the active surfaces of the two chips are connected together with C4 connections 18, as illustrated in FIG. 1. Solder for the C4 connections is provided on contacts of one of the two chips. Heat slug 20 is bonded to back surface 22 of chip 12 and heat slug 24 is bonded to back surface 25 of chip 16. An active surface of an integrated circuit chip is a surface comprising thin film metallization and devices, such as transistors, diodes, capacitors, and resistors. A back surface is a surface opposite an active surface of the chip. A back surface generally does not include transistors. Wire bonds 28 connect available wire bond pads 30 on active surface 10 of larger chip 12 to leads 32 of lead frame plastic package 34 for external connection. Chips 12 and 16 and portions of heat slugs 20 and 24 are encapsulated in lead frame plastic package 34 using standard injection molded packaging techniques. At least one surface of each heat slug is exposed at a surface of the plastic for improved thermal dissipation. Thus, plastic package 34 is equipped with a pair of heat slugs or heat sinks that efficiently remove heat from two opposing surfaces of a chip stack formed of chips 12 and 16 in face-to-face arrangement.

Alternative embodiments of the invention use a ball grid array package 40, as shown in FIGS. 2–6. In these embodiments the lower heat sink is provided integrated in a substrate, such as a printed circuit board or a multilayer ceramic. The printed circuit board is formed of a laminate material, such as FR4, BT Resin or Driclad™. Multilayer ceramics are commonly used for ball grid array packaging.

Figure 2:
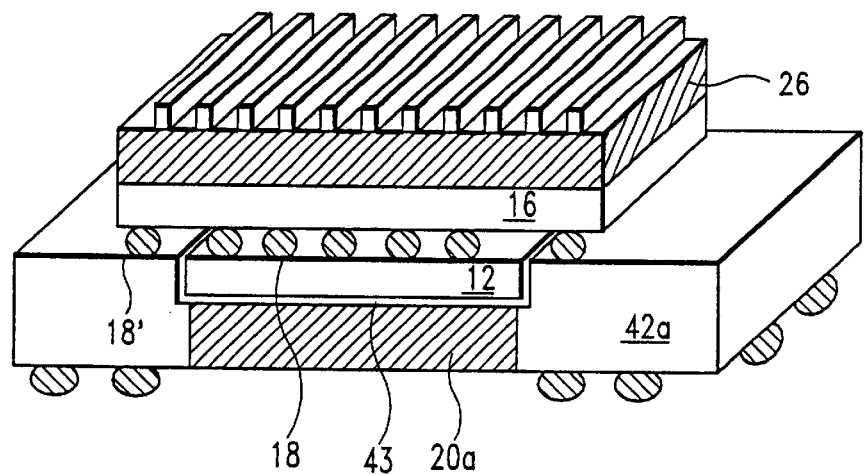
FIG. 2 is a cross sectional view of an embodiment of the invention in which the stacked chips are connected to each other and to a substrate of the package with C4 solder bumps, and one of the heat sinks is integrated into a cavity in the substrate of the package so that it extends from the back of one chip to an external surface of the package.

In one embodiment, chip 12 is bonded with thermal compound 43, such as a polymer-metal composite paste, to heat sink 20a integrated into substrate 42a, as shown in FIG. 2. Heat can be dissipated both through exposed fins of heat sink 26 and through heat sink 20a integrated in board 42a.

Facing chips 12 and 16 and portions of heat sink 20a and finned heat sink 26 are encapsulated (not shown).

Figure 3:
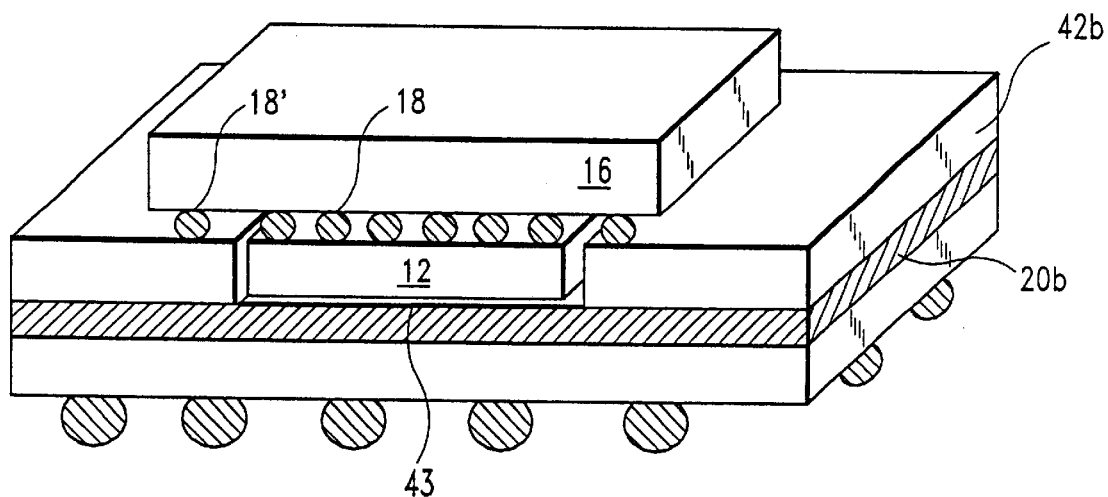
FIG. 3 is a cross sectional views of an embodiment of the invention similar to the embodiment of FIG. 2 except the heat sink integrated into the substrate is a plane of metal in that substrate.

Heat can also be dissipated by providing thick plane of metal 20b in substrate 42b, as shown in FIG. 3. In this embodiment, connections between chips and connections between chip 16 and substrate 42b are through C4 solder bump connections 18, 18'. Thick plane of metal 20b can be a ground plane of substrate 42b, facilitating noise reduction as well as providing for thermal transfer.

Figure 4:
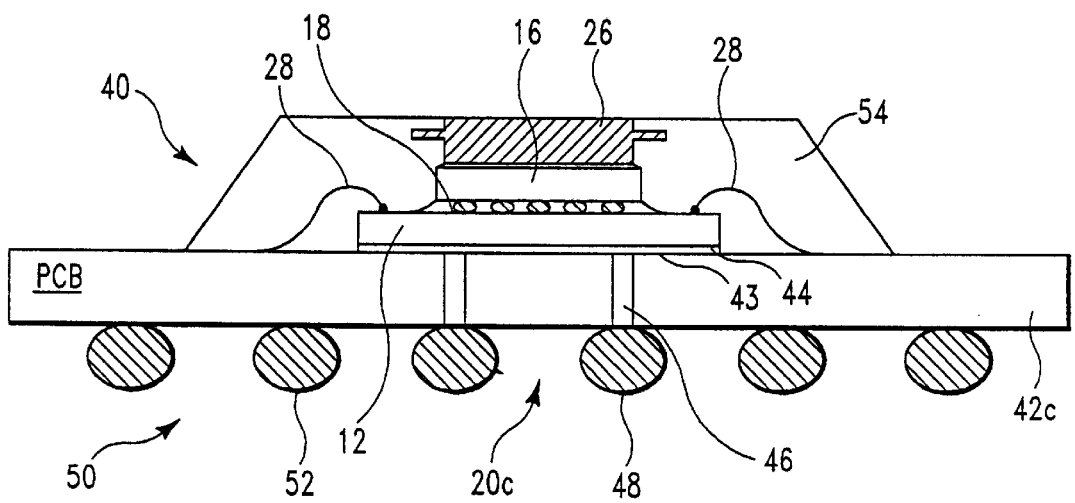
FIG. 4 is a cross sectional view of an embodiment of the invention in which the stacked chips are connected to each other with C4 solder bumps, the larger chip is connected to the substrate with wire bonds, the semiconductor structure is encapsulated in an overmolded molded ball grid array package (a form of injection molding), and one of the heat sinks is integrated into a substrate of the package so that it extends from the back of one chip through the substrate as vias.

In another embodiment, chip 12 is bonded with die attach adhesive 43 to heat sink 20c integrated in substrate 42c, as shown in FIG. 4. Heat sink 20c includes metal pad 44, vias 46, and solder balls 48. Metal pad 44 has an area at least as large as chip 12 to facilitate thermal transfer. Metal filled vias 46 extending through substrate 42c provide a path for transfer of heat to solder balls 48 forming part of ball grid array 50. Heat is thereby transferred away from chip 12 to the next level of assembly. Solder balls 48 may serve exclusively for thermal transfer through substrate 42c while other solder balls 52 provide electrical connection to chip 12 and chip 16 through wire bonds 28 and inter-chip C4 connections 18. Facing chips 12 and 16 and heat slug 26 are encapsulated in injection mold 54, so heat can be dissipated both through an exposed surface of heat slug 26 and through heat sink 20c integrated in substrate 42c.

Figure 5A:
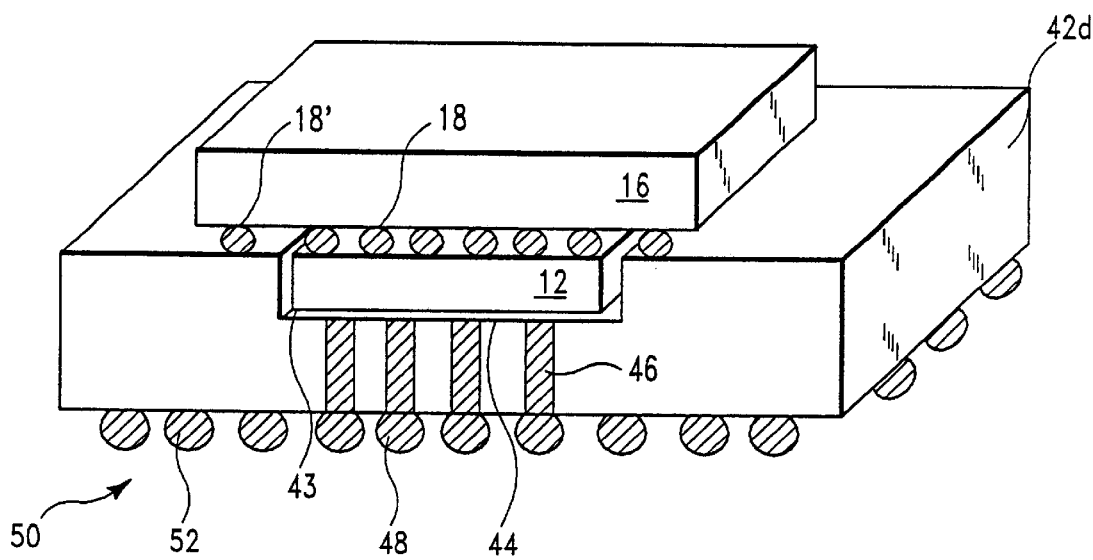
FIGS. 5a–5b are a cross sectional views of an embodiment of the invention similar to the embodiment of FIG. 4 except the chips are connected to each other and to the substrate with C4 solder bumps.
Figure 5B:
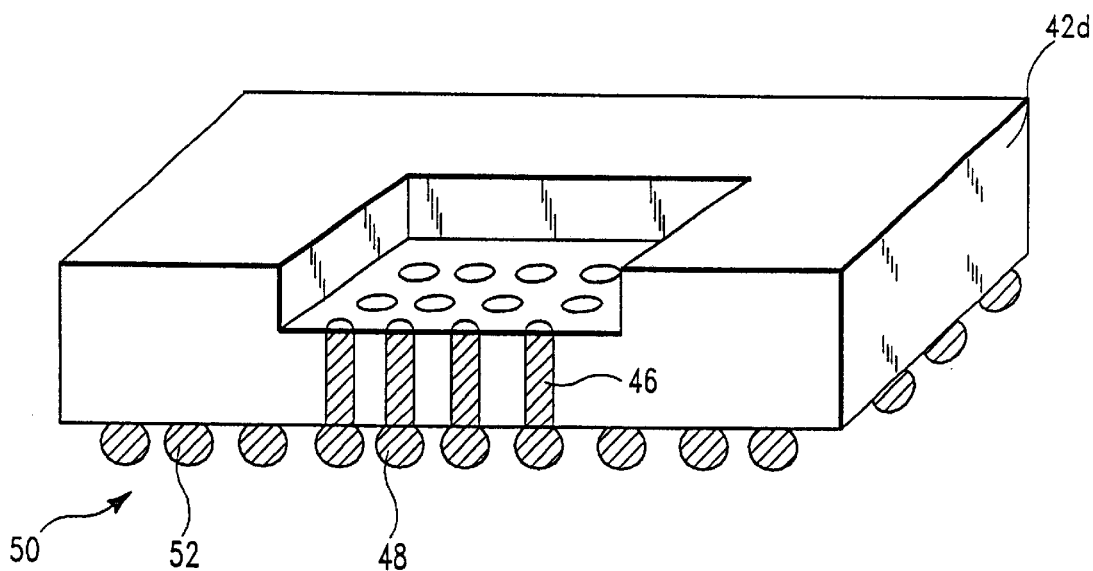

The thermal transfer scheme using metal filled vias 46, illustrated in FIG. 4, can also be used with the C4 solder bump interconnect scheme of FIG. 2, as shown in FIGS. 5a–5b. FIG. 5b more clearly shows the pattern of vias 46 in substrate 42d used to transfer heat. A chip sized metal pad (not shown for clarity) is provided to further facilitate heat flow from chip 12 to vias 46 and solder bumps 48. This pad is fabricated of gold plated aluminum or another thermally conductive material.

Figure 6:
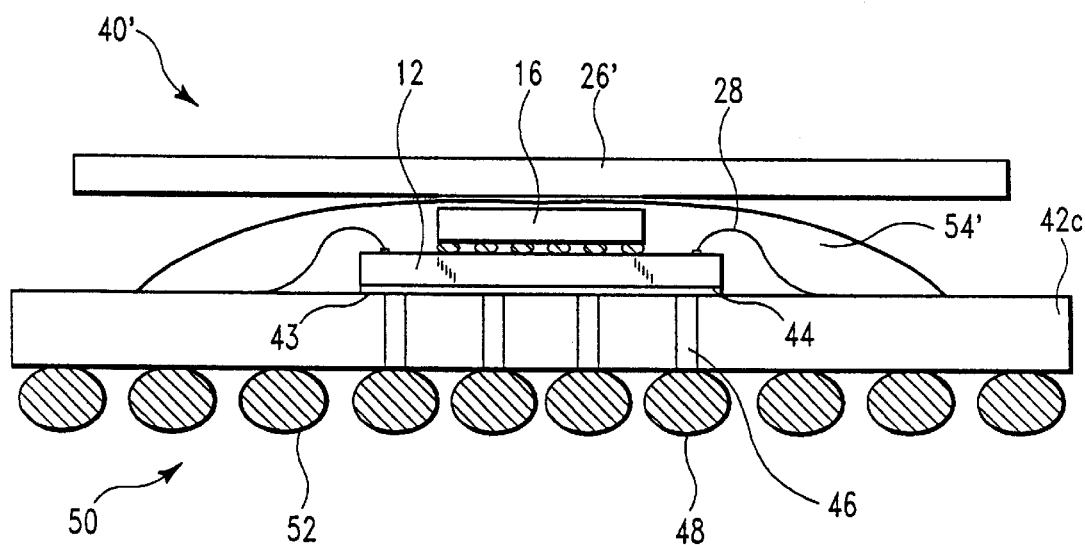
FIG. 6 is a cross sectional view of an embodiment of the invention similar to the embodiment of FIG. 4 except the module is encapsulated in a dispensed material and one of the heat sinks extends as a cap.

In addition to injection molded plastic, the chip and its contacts, such as wire bonds or C4s, can be encapsulated in dispensed material 54', such as Hysol 4627, a high temperature silica or alumina filled epoxy, as shown in FIG. 6. The encapsulating material protects the chips and improves the reliability of C4 and wire bond connections. In this case heat sink 26' need not be encapsulated, increasing the area for thermal dissipation. Heat sink 26' is made of a material such as aluminum or copper and is attached to chip 16 with a thermal adhesive, such as a high temperature silver filled epoxy, for example, Ablestik 8360, 8361, or 8355 or Sylgard 577.

Figure 7:
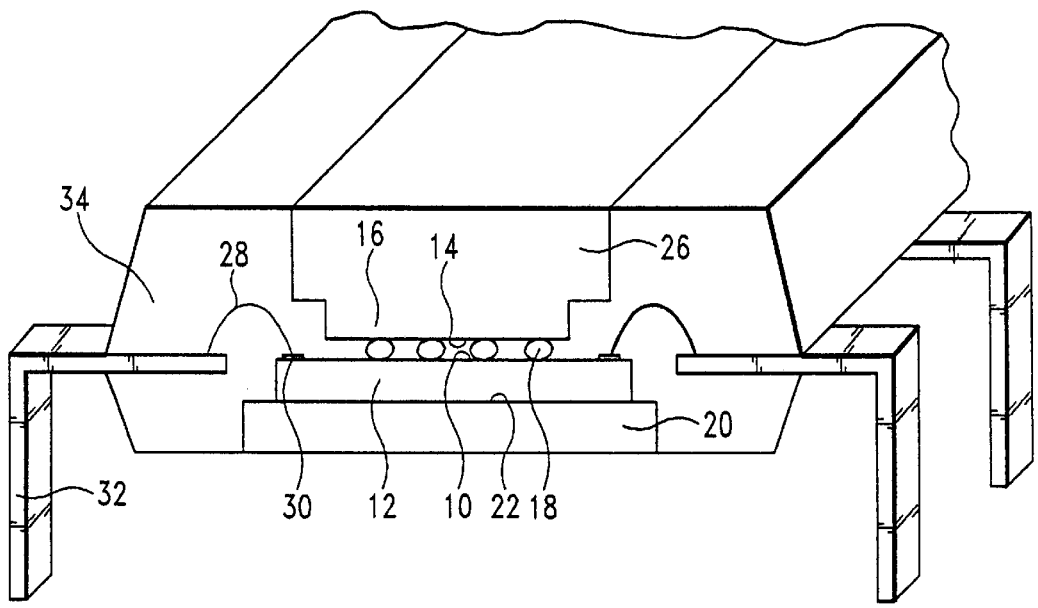
FIG. 7 is a perspective and a cross sectional view of an embodiment of the invention similar to the embodiment of FIG. 1 except the top chip has been replaced with a heat sink.

In another embodiment, chip 12 is the only active integrated circuit chip. Chip 16 of FIG. 1 may be an inactive semiconductor chip or a copper block. Solder bumps 18 connecting chips 12 and 16 connect chip 16 to a ground plane of chip 12. Thus, chip 12 is cooled both from front and back surfaces, facilitating heat removal. Heat slug or heat sink 26 can now be integrated with chip 16, as shown in FIG. 7. Chip 16 is replaced with heat sink or heat slug 26 C4 bonded directly to chip 12. Heat sink or heat slug 26 is connected to a ground plane of chip 12. Alternatively chip 16 or heat sink 26 can be connected to C4 pads of chip 12 that are left floating.

Figure 8:
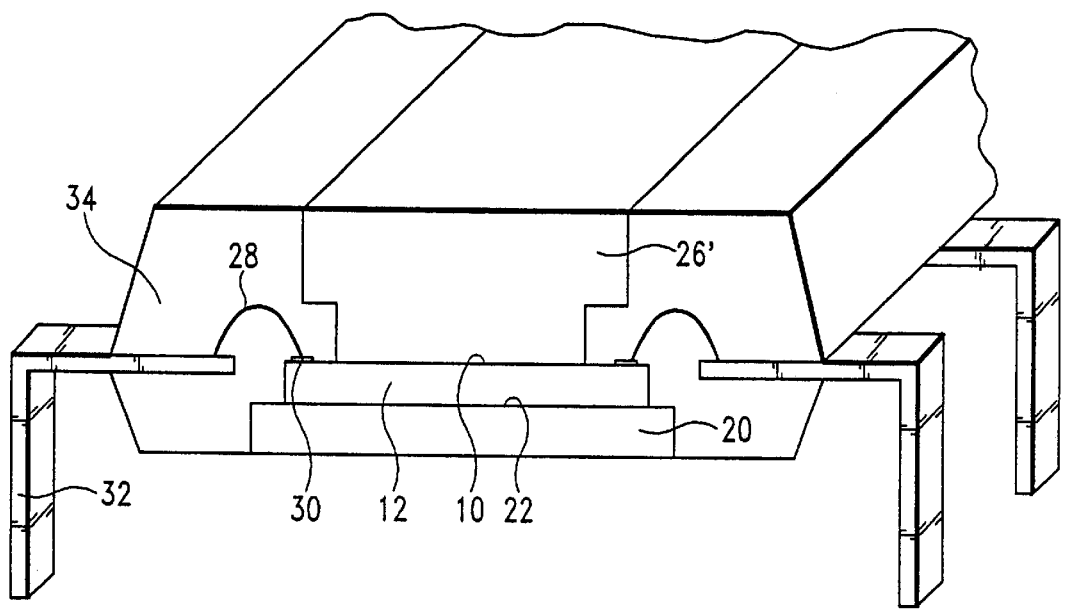
FIG. 8 is a perspective and a cross sectional view of an embodiment of the invention similar to the embodiment of FIG. 7 except the C4 solder bumps have been eliminated.

In another embodiment, C4 connections 18 are eliminated, and integrated heat sink 26' is attached more directly to front active surface 10 of chip 12, as shown in FIG. 8. Heat sink 26' is attached to chip 12 using thermal adhesive, and care is taken to avoid particles being trapped that could damage active surface 10 of chip 12. Thus, a high power chip that has peripheral contacts for electrical connection, such as a microprocessor, is cooled from both front and back surfaces, facilitating cooling.

Figure 9:
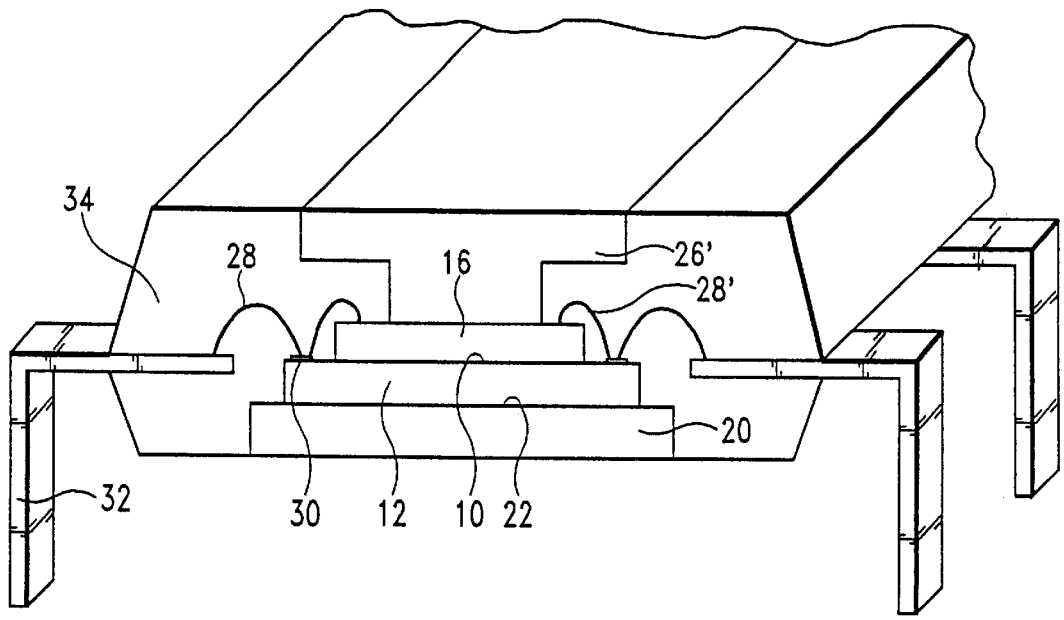
FIG. 9 is a cross sectional view of an embodiment of the invention in which the stacked chips are facing in the same direction, are connected to each other with wire bonds, and the heat sink or heat slug is mounted on an active surface of one of the chips.

A cross sectional view of another embodiment of the invention in which stacked chips 12 and 16 are facing in the same direction is shown in FIG. 9. Chip 12 is connected to chip 16 with wire bonds 28'. Heat sink or heat slug 26' is mounted on an active surface of chip 16.

While several embodiments of the invention, together with modifications thereof, have been described in detail herein and illustrated in the accompanying drawings, it will be evident that various further modifications are possible without departing from the scope of the invention. Nothing in the above specification is intended to limit the invention more narrowly than the appended claims. The examples given are intended only to be illustrative rather than exclusive.

What is claimed is:

1. A semiconductor module, comprising a substrate and a semiconductor structure, said semiconductor structure comprising a first surface and a second surface, a first heat sink or heat slug thermally contacting said first surface and a second heat sink or heat slug thermally contacting said second surface, said first heat sink or heat slug integrated in said substrate and said first heat sink or heat slug comprises metal filled vias and solder bumps not used for electrical signals, wherein said semiconductor structure comprises a first semiconductor chip stacked on a second semiconductor chip in an active-surface-facing-active-surface arrangement further wherein said first chip is connected to said second chip through a bump connection, said first surface being a back surface of said first chip, said second surface being a back surface of said second chip.

2. A semiconductor module as recited in claim 1, wherein said bump connection comprises solder.

3. A semiconductor module as recited in claim 1, wherein said first heat sink or heat slug and said second heat sink or heat slug are for removing heat from back surfaces of said first chip and said second chips simultaneously.

4. A semiconductor module as recited in claim 1, wherein said substrate comprises laminate material.

5. A semiconductor module as recited in claim 1, wherein said substrate comprises ceramic material.

6. A semiconductor module as recited in claim 1, wherein said first heat sink or heat slug is electrically connected to a ground plane of said chip.

* * * * *